US008208307B2

(12) United States Patent
Chang et al.

(10) Patent No.: US 8,208,307 B2
(45) Date of Patent: Jun. 26, 2012

(54) OPERATION METHOD OF MEMORY DEVICE

(75) Inventors: Ting-Chang Chang, Kaohsiung (TW);
Fu-Yen Jian, Ziguan Township (TW);
Shih-Ching Chen, Xinzhuang (TW);
Te-Chih Chen, Neipu Township (TW)

(73) Assignee: Acer Incorporated, Taipei (TW)

( * ) Notice: Subject to any disclaimer, the term of this patent is extended or adjusted under 35 U.S.C. 154(b) by 244 days.

(21) Appl. No.: 12/772,111

(22) Filed: Apr. 30, 2010

(65) Prior Publication Data

US 2011/0205799 A1 Aug. 25, 2011

(30) Foreign Application Priority Data

Feb. 22, 2010 (TW) ................................ 99104972 A

(51) Int. Cl.
*G11C 11/34* (2006.01)

(52) U.S. Cl. .......... 365/185.18; 365/185.29; 365/185.24

(58) Field of Classification Search ............. 365/185.18, 365/185.29, 185.24

See application file for complete search history.

(56) References Cited

U.S. PATENT DOCUMENTS

| | | | |
|---|---|---|---|
| 5,818,083 | A | 10/1998 | Ito |
| 6,512,703 | B2 | 1/2003 | Sakui et al. |
| 6,567,304 | B1 | 5/2003 | Kleveland |
| 6,639,836 | B1 | 10/2003 | Hung et al. |
| 7,113,431 | B1 | 9/2006 | Hamilton et al. |
| 7,345,920 | B2 | 3/2008 | Yeh |
| 7,349,262 | B2* | 3/2008 | Jeong et al. .............. 365/185.18 |
| 7,602,067 | B2 | 10/2009 | Ma et al. |
| 2007/0164352 | A1 | 7/2007 | Padilla et al. |
| 2007/0297227 | A1 | 12/2007 | Wu |
| 2008/0031052 | A1 | 2/2008 | Wu |

FOREIGN PATENT DOCUMENTS

| | | |
|---|---|---|
| TW | 510048 | 11/2002 |
| TW | 546787 | 8/2003 |
| TW | I250528 | 3/2006 |
| TW | 200746397 | 12/2007 |
| TW | 200746402 | 12/2007 |
| TW | I297500 | 6/2008 |
| TW | I316254 | 10/2009 |

OTHER PUBLICATIONS

Kahng et al., "A Floating Gate and Its Application to Memory Devices", The Bell System Technical Journal 46, Jul.-Aug. 1967, pp. 1288-1295.

(Continued)

*Primary Examiner* — Son Dinh
*Assistant Examiner* — Nam Nguyen
(74) *Attorney, Agent, or Firm* — Liu & Liu

(57) ABSTRACT

A method for operating a memory device is provided. In accordance with the method, the charges are stored in a source storage region, a drain storage region, and a channel storage region of a charge storage layer which respectively correspond to a source, a drain, and a channel of a SONOS transistor, thereby achieving 3-bit information storage in one cell. The channel storage region is programmed and erased by FN tunneling. Both of the source storage region and the drain storage region are programmed by channel hot electrons and erased by source-side or drain-side FN tunneling. The present invention can store three-bit data per cell, such that the storage density of the memory device can be substantially increased.

10 Claims, 8 Drawing Sheets

OTHER PUBLICATIONS

Hsu et al., "A Novel Channel-Program-Erase Technique with Substrate Transient Hot Carrier Injection for SONOS Memory Application", IEEE 2006, pp. 222-225.

Zous et al., "Edge FN Stress Induced Leakage Current in Tunnel Oxides", IEEE, pp. 262-265.

Wang et al, "A Novel SONOS Nonvolatile Flash Memory Device Using Substrate Hot-Hole Injection for Write and Gate Tunneling for Erase", Solid State Electronics 48 (2004), pp. 2031-2034.

Padilla et al, "Enhanced Endurance of Dual-bit SONOS NVM Cells Using the GIDL Read Method", IEEE 2008, pp. 142-143.

* cited by examiner

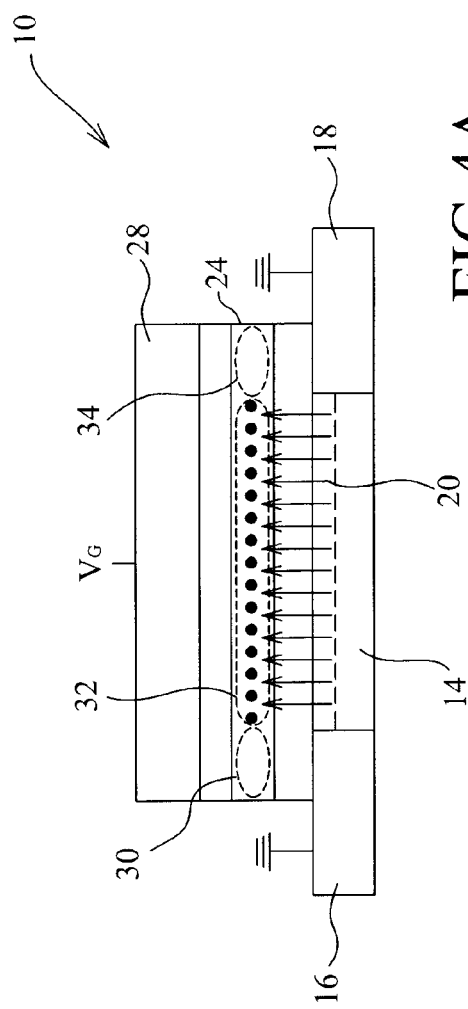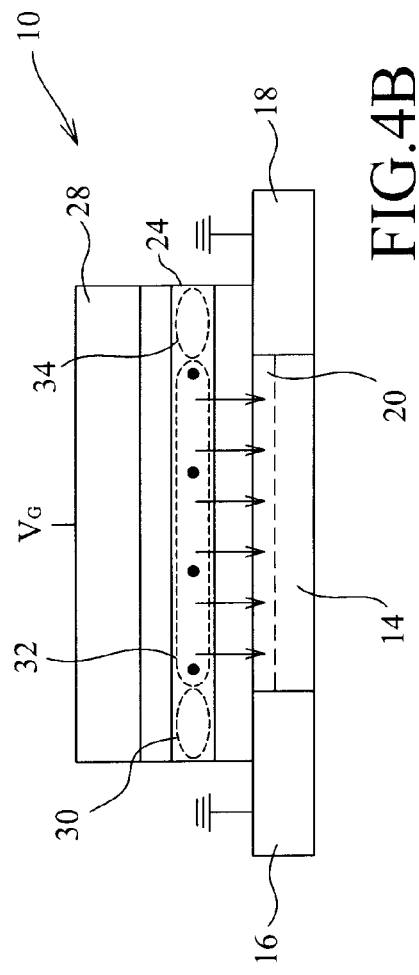

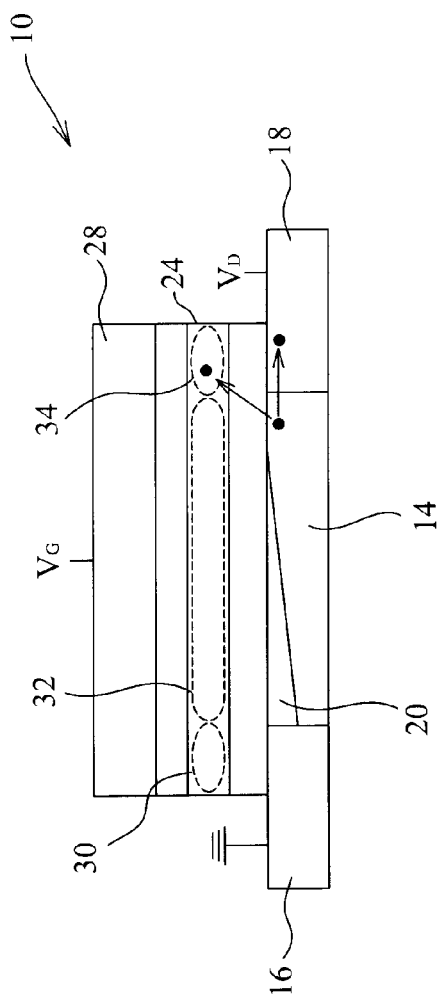
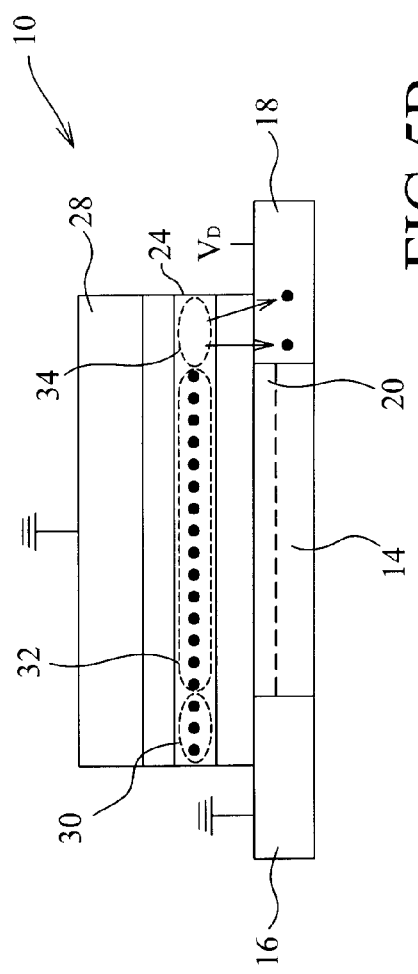

OPERATION METHOD OF MEMORY DEVICE

CROSS-REFERENCE TO RELATED APPLICATIONS

This application claims priority to Taiwan Patent Application No. 099104972 entitled "OPERATION METHOD OF MEMORY DEVICE", filed on Feb. 22, 2010, which is incorporated herein by reference.

FIELD OF INVENTION

The present invention relates to a method of operating a memory device, and more particularly, to a method of operating a memory device for storing multi-bit information within a single transistor.

BACKGROUND OF THE INVENTION

Typically, a two-bit SONOS (silicon-oxide-nitride-oxide-silicon) memory device is programmed by using channel hot electron injection, i.e. by injecting the electrons from the channel into a region of the silicon nitride layer near the source or near the drain. Since the electrons can be trapped locally at two opposite sides of the silicon nitride layer near the source and the drain, two bits per cell can be accomplished.

Further, multi bits per cell can be achieved by using multi-level cell (MLC) technique, which enables the memory cell to have multiple threshold voltages by storing different numbers of electrons into the floating gate. The state of the memory cell can be determined by applying a reading voltage between two of the multiple threshold voltages and then reading the corresponding current.

However, for these conventional multi-level cells, the voltage difference between the threshold voltages should be large enough to avoid erroneous determinations. Furthermore, the number of the electrons injected into the floating gate should be relatively precise, which results in complex operations and inferior reliability and endurance.

Consequently, it is necessary to provide an operation method of memory device capable of reducing erroneous detection and providing a wider range of reading voltages.

SUMMARY OF THE INVENTION

For obviating the problems due to limitations and disadvantages of the related arts, the present invention provides a method of operating a memory device to enable 3-bit information storage in a single transistor.

Considering the operation of the non-volatile memory, the method of the present invention stores the charges in different regions of a charge storage layer which are respectively above the source, the drain, and the channel of a memory device, thereby achieving 3-bit information storage in one cell. As a result, the memory density can be increased, and production costs of the memory device can be effectively reduced.

The method of the present invention is compatible with the known techniques of operating the memory device, such that no extra process step is need.

Regarding the region of the charge storage layer above the channel (i.e. the channel storage region described hereinafter), the present invention utilizes the Fowler-Nordheim (FN) tunneling to perform both of the program operation and the erase operation, whereby the programmed/erased state of the channel storage region can be determined by examining the threshold voltage of the memory device. Furthermore, regarding each of the regions of the charge storage layer above the source and the drain (i.e. the source storage region and the drain storage region described hereinafter), the channel hot electron injection and single-side FN tunneling are utilized to perform the program operation and the erase operation in the present invention, whereby the programmed/erased state of the source/drain storage region can be determined by examining the GIDL current of the source/drain.

For achieving the above-mentioned and other objects, one embodiment of the present invention is to provide an operation method of a memory device. The memory device includes a source, a drain, a channel between the source and the drain, a charge storage layer on the channel, and a gate on the charge storage layer. The source, the drain and the channel are located in a substrate, and the charge storage layer has a source storage region, a drain storage region, and a channel storage region respectively corresponding to the source, the drain, and the channel. The operation method includes the following steps: (a) applying a first positive voltage to the gate for injecting electrons into the channel storage region by FN tunneling; (b) applying a first negative voltage to the gate for removing electrons from the channel storage region by FN tunneling; (c) applying a second positive voltage and a third positive voltage to the gate and the drain respectively for injecting electrons into the drain storage region by channel hot electron injection; (d) applying a fourth positive voltage to the drain for removing electrons from the drain storage region by FN tunneling; (e) applying a fifth positive voltage and a sixth positive voltage to the gate and the source respectively for injecting electrons into the source storage region by channel hot electron injection; and (f) applying a seventh positive voltage to the source for removing electrons from the source storage region by FN tunneling.

Another embodiment of the present invention provides an operation method of a memory device including the following steps: a channel storage region programming step for increasing a threshold voltage of the memory device by injecting electrons into the channel storage region; a channel storage region erasing step for decreasing the threshold voltage of the memory device by removing electrons from the channel storage region; a drain storage region programming step for increasing a gate-induced drain leakage (GIDL) current of the drain by injecting electrons into the drain storage region; a drain storage region erasing step for decreasing the GIDL current of the drain by removing electrons from the drain storage region; a source storage region programming step for increasing a gate-induced drain leakage (GIDL) current of the source by injecting electrons into the source storage region; and a source storage region erasing step for decreasing the GIDL current of the source by removing electrons from the source storage region.

The other aspects of the present invention, part of them will be described in the following description, part of them will be apparent from description, or can be known from the execution of the present invention. The aspects of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying pictures, wherein:

FIGS. 4A and 4B are schematic diagrams respectively showing the program operation and the erase operation of the channel storage region in accordance with one embodiment of present invention;

FIGS. 5A and 5B are schematic diagrams respectively showing the program operation and the erase operation of the drain storage region in accordance with one embodiment of present invention.

DETAILED DESCRIPTION

The present invention directs to an operation method of memory device for achieving 3-bit information storage in one cell by storing charges in a source storage region, a drain storage region, and a channel storage region of a charge storage layer which are respectively near the source, the drain, and the channel of the memory device. To make the disclosure of the present invention more detailed and complete, references are made to the following description in conjunction with FIG. 1 to FIG. 5D. However, the drawings illustrated in the figures are not necessarily to scale and only intended to serve as illustrating embodiments of the invention, and the devices, elements, or operations in the following embodiments are provided for exemplary purposes only. It should be noted that when an element is referred to as being "on" another element, it can be directly on the other element or intervening elements may also be present, unless explicitly defined otherwise herein.

Figure 1:
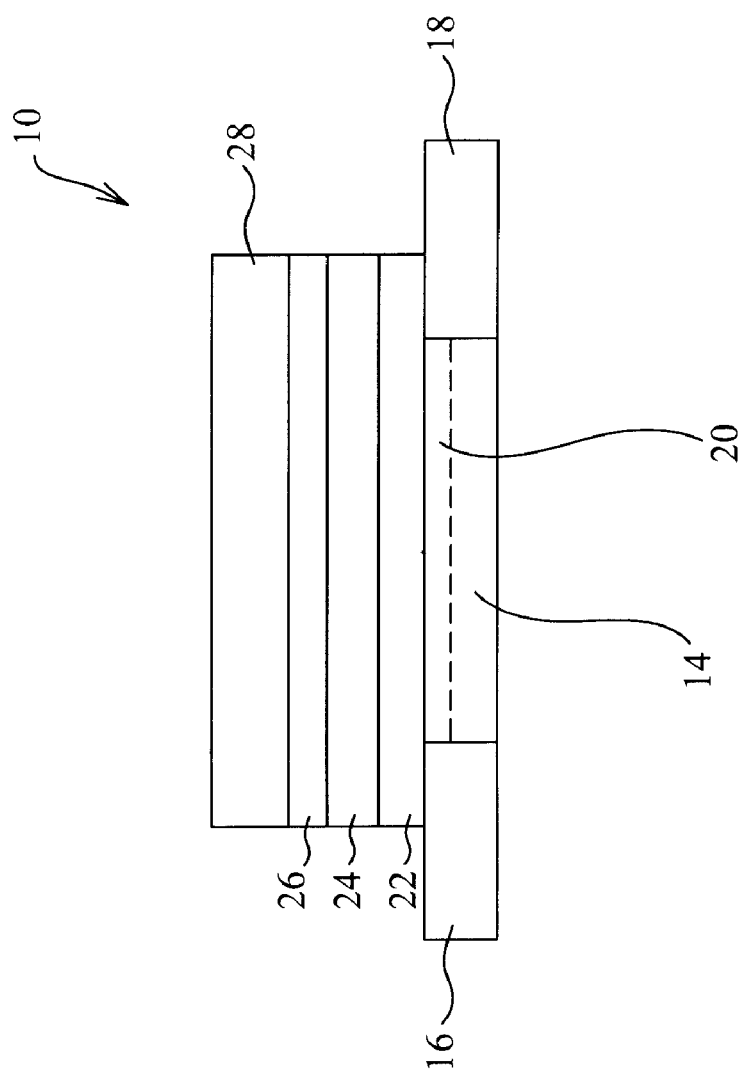
FIG. 1 is a cross-sectional view of a n-channel SONOS memory device suitable for practicing an operation method of memory device in accordance with one embodiment of the present invention.

FIG. 1 is a cross-sectional view of an n-channel SONOS memory device 10 suitable for practicing an operation method of memory device in accordance with one embodiment of the present invention. The memory device 10 includes a silicon substrate 14, a first insulating layer 22, a charge storage layer 24, a second insulating layer 26, and a gate 28. The silicon substrate 14 is doped in conventional manner to define a source 16, a drain 18, and a channel 20, wherein the source 16 and the drain 18 are located below two opposite sides of the gate 28 within the silicon substrate 14 and the channel 20 is located under the gate 28 between the source 16 and drain 18 within the silicon substrate 14. Generally, the source 16 and the drain 18 have the same dopant type which is different from that of the silicon substrate 14. For example, in this embodiment, the silicon substrate 14 is p-doped silicon, and the source 16 and the drain 18 are n-doped silicon, but the present invention is not limited to this only.

The charge storage layer 24, being located between the first insulating layer 22 and the second insulating layer 26, is configured to constrain the injected electrons or holes. In a preferred embodiment, the charge storage layer 24 can be implemented by silicon nitride. In another embodiment, the charge storage layer 24 can be implemented by aluminum oxide, tantalum oxide, titanium oxide, or other suitable material capable of storing charges.

Figure 2:
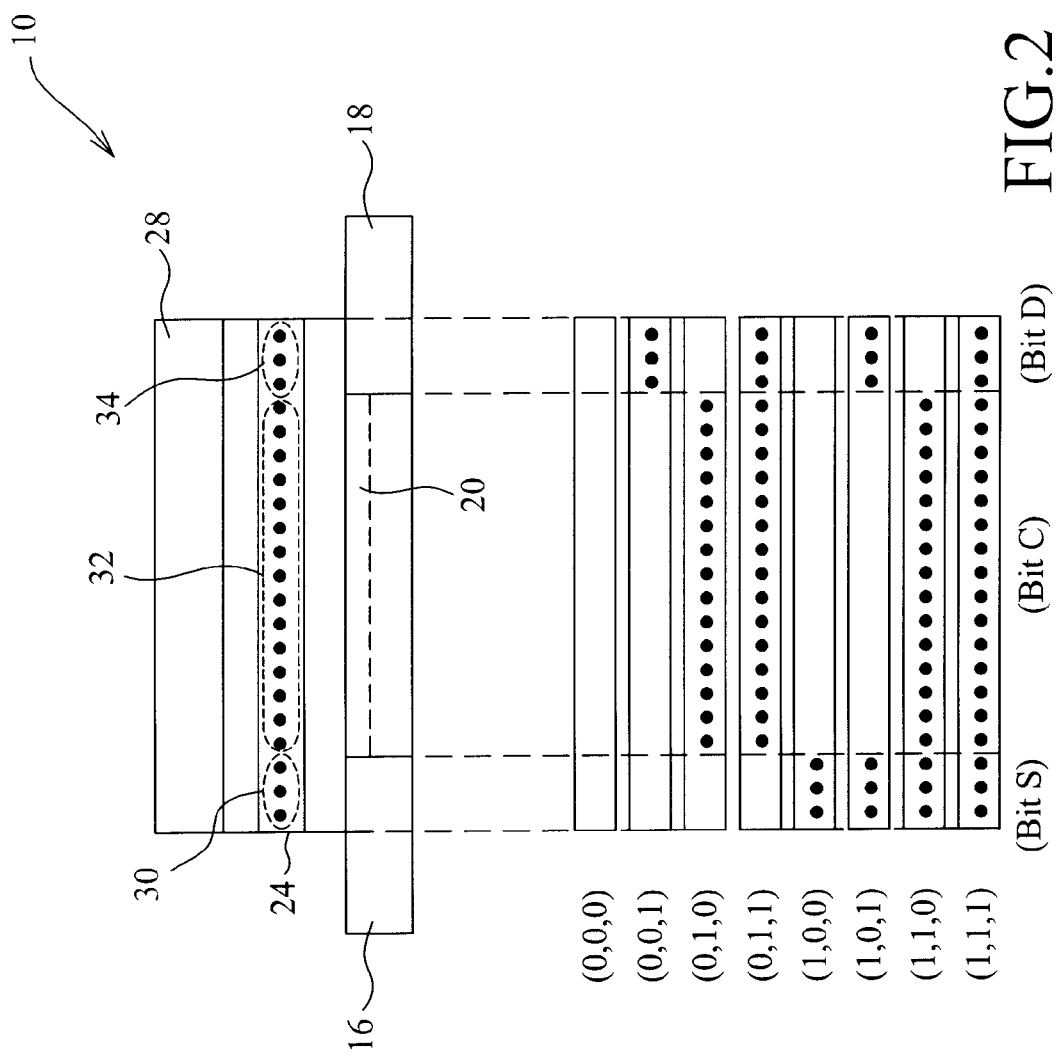
FIG. 2 is a schematic diagram for illustrating the operation principle of a memory device according to one embodiment of the present invention.

In one embodiment of the present invention, a method of operating a memory device is provided to achieve multi-bit storage, wherein the memory device is preferably a non-volatile memory device. The method of the present invention is hereinafter described in connection with the above-mentioned n-channel SONOS memory device 10. FIG. 2 is a schematic diagram for illustrating the principle of operating a memory device according to one embodiment of the present invention. The charge storage layer 24 of the SONOS memory device 10 includes a source storage region 30, a channel storage region 32, and a drain storage region 34 whose locations are corresponding to the source 16, the channel 20, and the drain 18, respectively. The source storage region 30, the channel storage region 32, and the drain storage region 34 can be programmed and erased individually, such that at least three bits (bit S, bit C, and bit D) of data can be stored. As shown in FIG. 2, the symbol (a, b, c) represents the storage states of the source storage region 30, the channel storage region 32, and the drain storage region 34, where the numeral 1 represents a programmed state and the numeral 0 represents an erased state. For example, (0,1,1) represents that the source storage region 30 is in the erased state, and both of the channel storage region 32 and the drain storage region 34 are in the programmed state. Compared with the conventional memory device 10 having only two logic states (i.e. state 0 and state 1), the memory device 10 operated by the method of the present invention has eight different memory states (i.e. (0,0,0), (0,0,1), (0,1,0), (0,1,1), (1,0,0), (1,0,1), (1,1,0), (1,1,1)), such that the storage density can be increased effectively and the thus unit cost of the memory device can be reduced.

Figure 3:
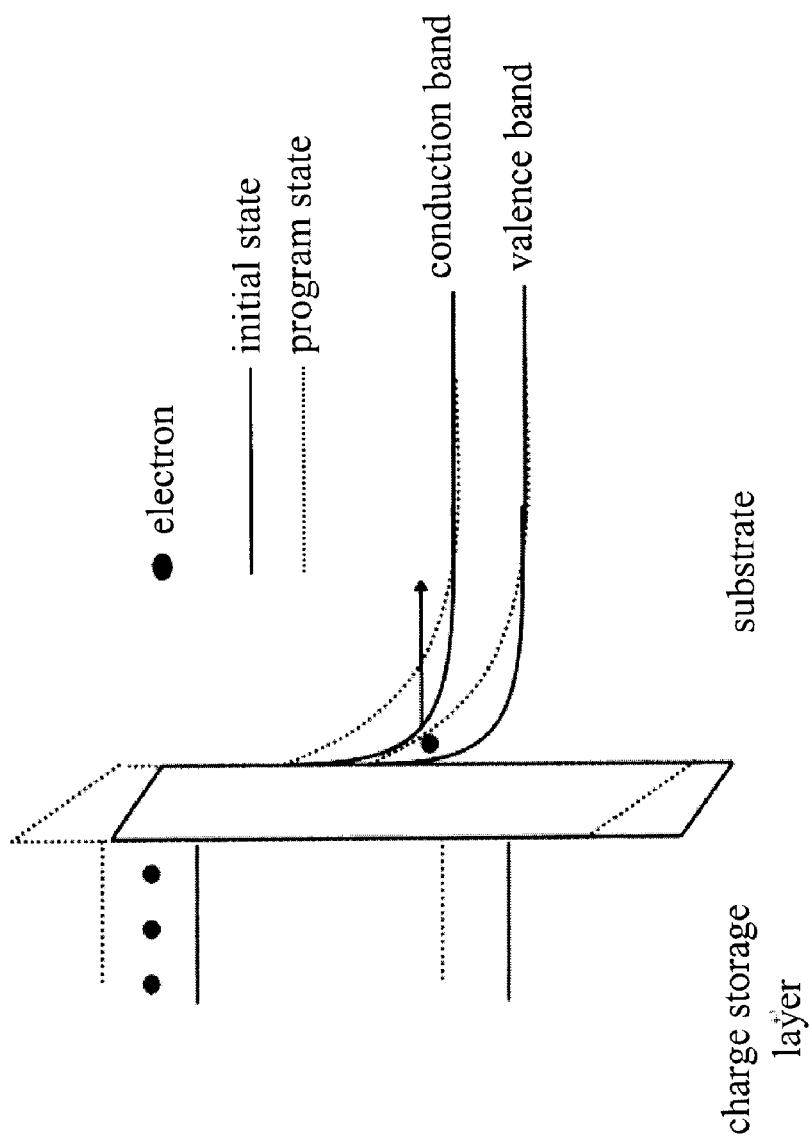
FIG. 3 is an energy band diagram showing the mechanism of the gate-induced drain leakage (GIDL) current.

The injection of electrons into the channel storage region 32 raises the threshold voltage Vt of the memory device 10, such that the threshold voltage Vt can be used as a criterion to determine the state (programmed or erased) of the channel storage region 32. On the other hand, since the electrons, being injected into the source storage region 30 and the drain storage region 34, are located above the depletion regions formed between the channel 20 and the source 16 and between the channel 20 and the drain 18 the gate-induced drain leakage (GIDL) current of the source 16 and the drain 18 can be increased without affecting the threshold voltage Vt. FIG. 3 is an energy band diagram showing the mechanism of the GIDL current. The major reason for the increase of the GIDL current is that: the energy band bending in the overlap region between the gate 28 and the drain 18 caused by a large electrical field which is generated by the electrons injected into the drain storage region 34. The bending of energy band allows the electrons in the valence band of the drain 18 to tunnel to the conduction band and therefore a large number of electron-hole pairs are generated, which results in a large GIDL current as well as the drain current.

As described above, the storage states of the source storage region 30, the channel storage region 32, and the drain storage region 34 can be respectively determined by the GIDL current of the source 16, the threshold voltage Vt of the channel 20, and the GIDL current of the drain 18. In another embodiment, the method of the present invention can control the number of the injected electrons by utilizing the conventional Multi-level cell (MLC) technique. As a result, each storage region of the charge storage layer 24 can store N different numbers of electrons corresponding to N different logic states respectively, and thus a goal of multi-bit storage can be achieved. For example, if each of the source storage region 30, the channel storage region 32, and the drain storage region 34 is configured to store four different numbers of electrons, there can be $4^3=64$ different logic states, which is equivalent to 6-bit data per memory cell.

FIGS. 4A and 4B are schematic diagrams respectively showing the program operation and the erase operation of the channel storage region 32 in accordance with one embodiment of present invention. In the embodiment shown in FIG. 4A, the program operation of the channel storage region 32 is implemented by FN tunneling mechanism, which operates by reference to the following steps: applying a positive voltage $V_G$ to the gate 28 of the memory device 10, and grounding (or floating or applying 0 volt to) both of the source 16 and the drain 18. The positive $V_G$ applied on the gate 28 is in between about 20 volts and about 40 volts (preferably is 30 volts) and lasts for about 0.05 seconds to about 0.2 seconds (preferably 0.1 seconds), which enables the electrons in the channel 20 to tunnel to the channel storage region 32 above the channel 20. During the program operation of the channel storage region 32, the threshold voltage Vt is increased gradually. Next, in the embodiment shown in FIG. 4B, the erase operation of the channel storage region 32 is also implemented by FN tunneling mechanism, which operates by reference to the followings steps: applying a negative voltage $V_G$ to the gate 28 of the memory device 10, and grounding (or floating or applying 0 volt to) both of the source 16 and the drain 18. The negative $V_G$ applied on the gate 28 is in between about −30 volts and about −50 volts (preferably is −40 volts) and lasts for about 0.05 seconds to about 0.2 seconds (preferably 0.1 seconds), which enables the electrons stored in the channel storage region 32 to tunnel to the channel 20. During the erase operation of the channel storage region 32, the threshold voltage Vt is decreased gradually.

Figure 4C:
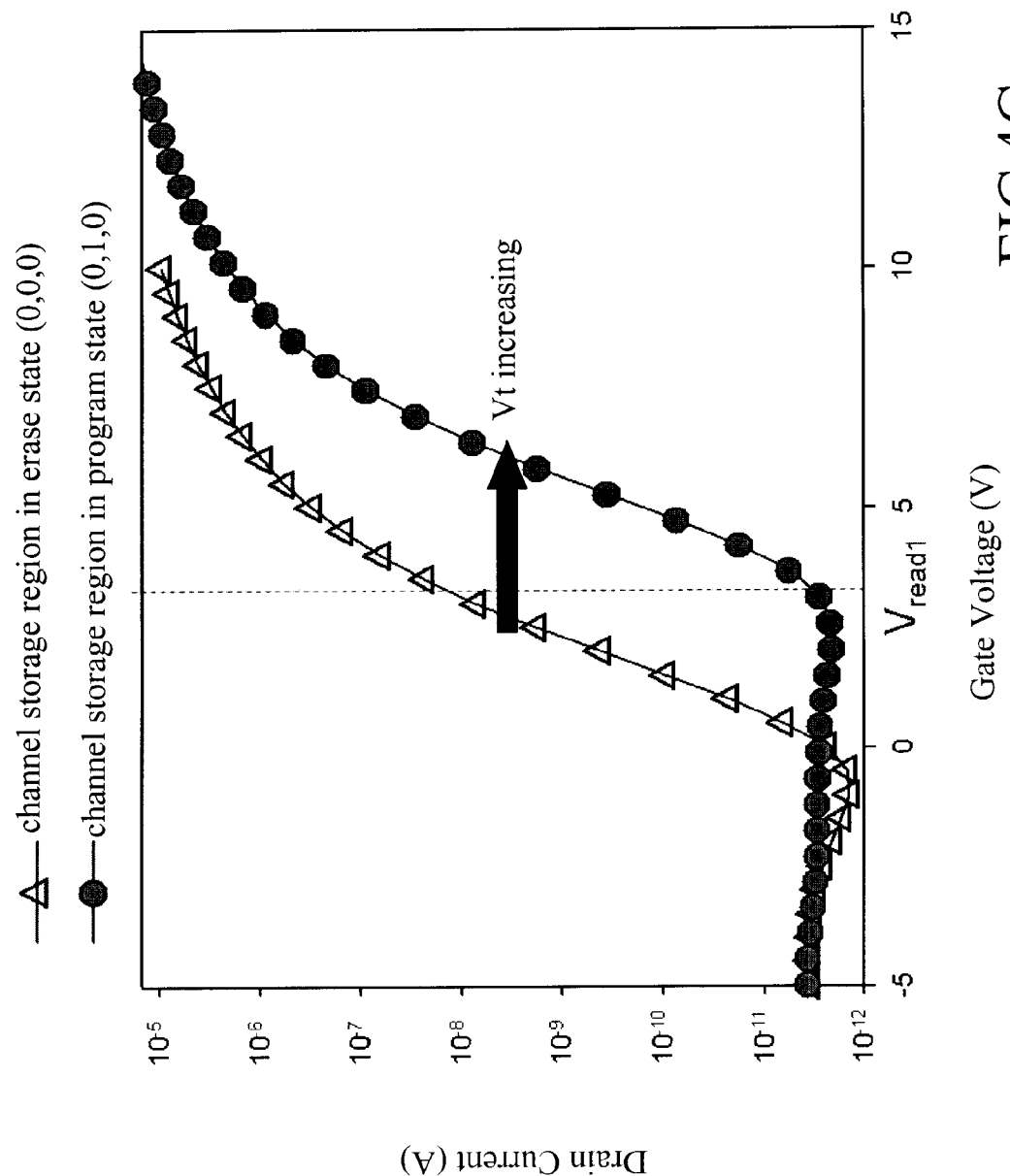
FIG. 4C shows the drain current versus gate voltage characteristics after performing the program operation for the channel storage region of the memory device in accordance with one embodiment of present invention.

FIG. 4C shows the drain current versus gate voltage characteristics before and after performing the program operation for the channel storage region 32 of the memory device 10 in accordance with one embodiment of present invention, wherein both of the source storage region 30 and the drain storage region 34 are in the erased state. As shown in FIG. 4C, the threshold voltage Vt is increased from state (0,0,0) to state (0,1,0) due to injection of electrons into the channel storage region 32, whereby the storage state of the channel storage region 32 can be determined based on the level of the threshold voltage Vt. For example, a read voltage $V_{read\,1}$, which is in between two threshold voltages corresponding to the programmed state and the erased state, respectively, can be applied to the gate 28, and thereby the storage state of the channel storage region 32 can be determined by measuring a drain current corresponding to the read voltage $V_{read\,1}$. In the embodiment shown in FIG. 4C, the drain current is measured under the condition that: 3 volts being applied to the gate 28, 0.1 volts being applied to the drain 18, and 0 volt being applied to the source 16. In this circumstance, if the drain current is $10^{-8}$ A, the channel storage region 32 is supposed to be in the erased state; and if the drain current is $10^{-11}$ A, the channel storage region 32 is supposed to be in the programmed state.

FIGS. 5A and 5B are schematic diagrams respectively showing the program operation and the erase operation of the drain storage region 34 in accordance with one embodiment of present invention. In the embodiment shown in FIG. 5A, the electrons are injected into the drain storage region 34 above the drain 18 by channel hot electron injection. For example, the program operation of the drain storage region 34 includes the following steps: applying a positive voltage $V_G$ to the gate 28, applying a positive voltage $V_D$ to the drain 18, and grounding (or floating or applying 0 volt to) the source 16. The positive $V_G$ applied on the gate 28 is in between about 10 volts and about 25 volts (preferably is 17 volts) and lasts for about 0.05 seconds to about 0.2 seconds (preferably 0.1 seconds), and the positive $V_D$ applied on the drain 18 is in between about 15 volts and about 35 volts (preferably is 25 volts) and lasts for about 0.05 seconds to about 0.2 seconds (preferably 0.1 seconds). The electrons in the channel 20 obtain energy during this program process, thereby reaching the drain storage region 24 above the drain 18, resulting in higher GIDL current of drain 18. Next, in the embodiment shown in FIG. 5B, the erase operation of the drain storage region 34 is implemented by single-side FN tunneling mechanism, which operates by reference to the followings steps: applying a positive voltage $V_D$ to the drain 18 of the memory device 10, and grounding (or floating or applying 0 volt to) both of the source 16 and the gate 28. The positive $V_D$ applied on the drain 18 is in between about 15 volts and about 35 volts (preferably is 25 volts) and lasts for about 0.05 seconds to about 0.2 seconds (preferably 0.1 seconds), so that the electrons stored in the drain storage region 34 can be removed and the GIDL current of the drain 18 can be reduced accordingly. It can be appreciated that the program operation and the erase operation of the source storage region 30 are similar to that of the drain storage region 34, so the detail description thereof is omitted.

Figure 5C:
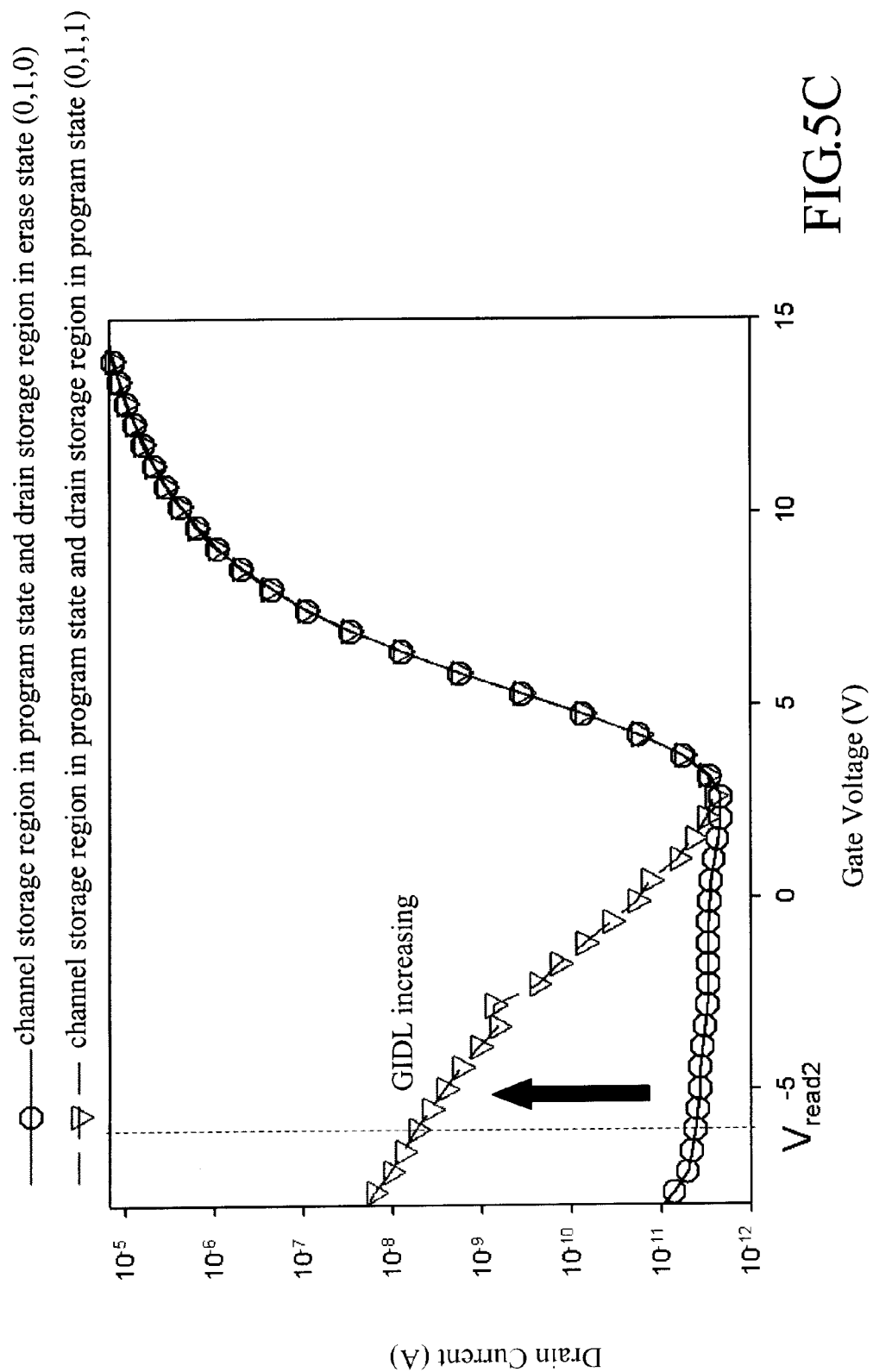
FIGS. 5C and 5D show the drain current versus gate voltage characteristics after performing the program operation and the erase operation for the drain storage region of the memory device in accordance with one embodiment of present invention.
Figure 5D:
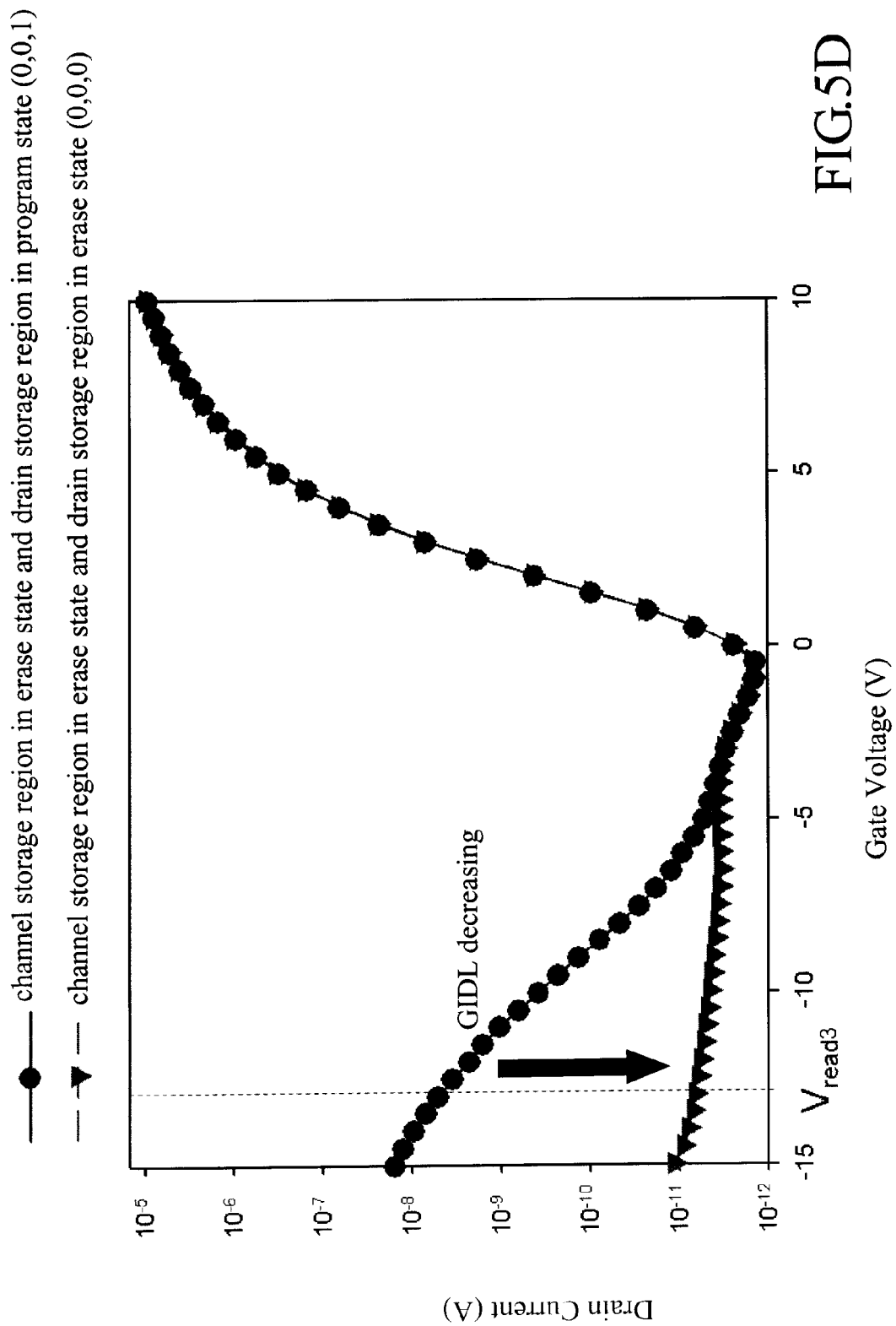

FIGS. 5C and 5D show the drain current versus gate voltage characteristics after performing the program operation and the erase operation for the drain storage region 34 of the memory device 10 in accordance with one embodiment of present invention. In the embodiment of FIG. 5C, the source storage 30 is in the erased state and the channel storage region 32 is in the programmed state; while in the embodiment of FIG. 5D, both of the source storage region 30 and the channel storage region 32 are in the erased state. As shown in FIG. 5C, the GIDL current of the drain 18 is increased from state (0,1,0) to state (0,1,1) due to injection of electrons into the drain storage region 34, whereby the storage state of the drain storage region 18 can be determined based on the magnitude of the GIDL current of the drain 18. In the embodiment shown in FIG. 5C, the drain current is measured under the condition that: −6 volts being applied to the gate 28, 2 volts being applied to the drain 18, and 0 volt being applied to the source 16. In this circumstance, if the drain current is $10^{-11}$ A, the drain storage region 34 is in the erased state; and if the drain current is $10^{-8}$ A, the drain storage region 34 is in the programmed state. Referring to FIG. 5D, because the electrons stored in the drain storage region 34 are removed by the erase operation, the GIDL current of the drain 18 is decreased from state (0,0,1) to state (0,0,0). In this embodiment, the drain current is measured under the condition that: −13 volts being applied to the gate 28, 2 volts being applied to the drain 18, and 0 volt being applied to the source 16. Therefore, it can be seen that if the drain current is $10^{-11}$ A, the drain storage region 34 is in the erased state; and if the drain current is $10^{-8}$ A, the drain storage region 34 is in the programmed state.

Generally, the operating sequence of the source storage region 30, the drain storage region 34, and the channel storage region 32 is not limited by the present invention. However, in order to reduce the influence of the program/erase operation of the channel storage region 32 on the charges in the source storage region 30 and the drain storage region 34, it is preferable that the program/erase operation of the channel storage region 32 should be done prior to that of the source storage region 30 and the drain storage region 34. On the other hand, the sequence of reading the storage state of the memory device is preferably as follows: determining the threshold voltage Vt first, and then determining the reading voltages of the GIDL current based on the threshold voltage Vt. For instance, referring again to the example shown in FIGS. 5C and 5D, the threshold voltage Vt is determined first to ascertain the storage state of the channel storage region 32. Then, if the storage state of the channel storage region 32 is determined as "1", the reading voltage of the GIDL current is chosen to be about −6 volts (as shown in FIG. 5C); while if the storage state of the channel storage region 32 is determined as "0", the reading voltage of the GIDL current is chosen to be about −13 volts (as shown in FIG. 5D).

The invention is not limited to the type of the memory device or the experimental conditions and parameters set forth in the above-described embodiments. Although the above description has solely referred to the N-type channel memory device, the operation method of the present invention is also applicable to the P-type channel memory device. The memory device used in the present invention is compatible to other program/erase mechanism and its structure or components can be flexibly adjusted according to practical need. In addition, the actual operating parameters of the memory device can vary with the type, structure, and material of the memory device and should not be restricted to the above embodiments.

Compared with the multi-level cell (MLC) technique which requires a large voltage difference between two different threshold voltages to achieve multi-bit storage, neither large difference between the threshold voltages nor precise number of electrons injected into the floating gate are required in the method disclosed in the present invention by storing the electrical charges in different spatial locations of the charge storage layer. Therefore, erroneous determination can be prevented, and reliability as well as endurance can improved. Furthermore, by changing the voltage operation of the memory device, a goal of storing 3-bit or more data per cell can be achieved simply in the present invention. For this reason, it is compatible with the manufacturing process and operation method of the existing flash memory. In addition, since the memory device used in the present invention can be a thin film transistor, the method according to the present invention advantageously can be combined with flat panel display industry and further can be applied to the system-on-panel display applications. Consequently, the storage density of the memory device can be substantially increased, and the cost of the memory device can be significantly reduced.

While this invention has been described with reference to the illustrative embodiments, these descriptions should not be construed in a limiting sense. Various modifications of the illustrative embodiments, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. A method of operating a memory device, the memory device comprising a source, a drain, a channel between the source and the drain, a charge storage layer on the channel, and a gate on the charge storage layer, the source, the drain and the channel located in a substrate, the charge storage layer having a source storage region, a drain storage region, and a channel storage region respectively corresponding to the source, the drain, and the channel, the operation method comprising the following steps:

(a) applying a first positive voltage to the gate for injecting electrons into the channel storage region by FN tunneling;

(b) applying a first negative voltage to the gate for removing electrons from the channel storage region by FN tunneling;

(c) applying a second positive voltage and a third positive voltage to the gate and the drain respectively for injecting electrons into the drain storage region by channel hot electron injection; and (d) applying a fourth positive voltage to the drain for removing electrons from the drain storage region by FN tunneling.

2. The method according to claim 1, further comprising:

(e) applying a fifth positive voltage and a sixth positive voltage to the gate and the source respectively for injecting electrons into the source storage region by channel hot electron injection; and (f) applying a seventh positive voltage to the source for removing electrons from the source storage region by FN tunneling.

3. The method according to claim 1, wherein in the step (a), the first positive voltage is in between about 20 volts and about 40 volts and lasts for between about 0.05 seconds and about 0.2 seconds, and the source and the drain are grounded, biased at 0 volt, or floating.

4. The method according to claim 1, wherein in the step (b), the negative voltage is in between about −30 volts and about −50 volts and lasts for between about 0.05 seconds and about 0.2 seconds, and the source and the drain are grounded, biased at 0 volt, or floating.

5. The method according to claim 2, wherein in the step (c), the second positive voltage is in between about 10 volts and about 25 volts, the third positive voltage is in between about 15 volts and about 35 volts, the second positive voltage and the third positive voltage both last for between about 0.05 seconds and about 0.2 seconds, and the source is grounded, biased at 0 volt, or floating; and wherein in the step (e), the fifth positive voltage is in between about 10 volts and about 25 volts, the sixth positive voltage is in between about 15 volts and about 35 volts, the fifth positive voltage and the sixth positive voltage both last for between about 0.05 seconds and about 0.2 seconds, and the drain is grounded, biased at 0 volt, or floating.

6. The method according to claim 2, wherein in the step (d), the fourth positive voltage is in between about 15 volts and about 35 volts and lasts for between about 0.05 seconds and about 0.2 seconds, and the source and the gate are grounded, biased at 0 volt, or floating; and wherein in the step (f), the seventh positive voltage is in between about 15 volts and about 35 volts and lasts for between about 0.05 seconds and about 0.2 seconds, and the drain and the gate are grounded, biased at 0 volt, or floating.

7. The method according to claim 1, further comprising: measuring a threshold voltage of the memory device to determine whether the channel storage region is in a programmed state or in an erased state.

8. The method according to claim 2, further comprising: measuring a gate-induced drain leakage (GIDL) current of the drain to determine whether the drain storage region is in a programmed state or in an erased state; and measuring a GIDL current of the source to determine whether the source storage region is in a programmed state or in an erased state.

9. The method according to claim 1, wherein each of the source storage region, the drain storage region, and the channel storage region has a plurality of logic states respectively corresponding to different numbers of stored electrons.

10. A method of operating a memory device, the memory device comprising a source, a drain, a channel between the source and the drain, a charge storage layer on the channel, and a gate on the charge storage layer, the source, the drain and the channel located in a substrate, the charge storage layer having a source storage region, a drain storage region, and a channel storage region respectively corresponding to the source, the drain, and the channel, the operation method comprising:

- a channel storage region programming step for increasing a threshold voltage of the memory device by injecting electrons into the channel storage region of the charge storage layer;
- a channel storage region erasing step for decreasing the threshold voltage of the memory device by removing electrons from the channel storage region of the charge storage layer;
- a drain storage region programming step for increasing a gate-induced drain leakage (GIDL) current of the drain by injecting electrons into the drain storage region of the charge storage layer;
- a drain storage region erasing step for decreasing the GIDL current of the drain by removing electrons from the drain storage region of the charge storage layer;
- a source storage region programming step for increasing a gate-induced drain leakage (GIDL) current of the source by injecting electrons into the source storage region of the charge storage layer; and
- a source storage region erasing step for decreasing the GIDL current of the source by removing electrons from the source storage region of the charge storage layer.

* * * * *